(12) United States Patent
Katsuki

(10) Patent No.: US 10,461,024 B2
(45) Date of Patent: Oct. 29, 2019

(54) SEMICONDUCTOR DEVICE

(71) Applicant: FUJI ELECTRIC CO., LTD., Kawasaki-shi, Kanagawa (JP)

(72) Inventor: Takashi Katsuki, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/397,692

(22) Filed: Jan. 3, 2017

(65) Prior Publication Data
US 2017/0229389 A1    Aug. 10, 2017

(30) Foreign Application Priority Data
Feb. 5, 2016  (JP) ................... 2016-020743

(51) Int. Cl.
*H01L 23/498*  (2006.01)
*H01L 23/049*  (2006.01)

(52) U.S. Cl.
CPC ...... *H01L 23/49861* (2013.01); *H01L 23/049* (2013.01); *H01L 23/49811* (2013.01); *H01L 2224/48091* (2013.01); *H01L 2224/48472* (2013.01); *H01L 2224/4903* (2013.01); *H01L 2224/49111* (2013.01); *H01L 2224/49175* (2013.01); *H01L 2224/73265* (2013.01); *H01L 2924/19105* (2013.01); *H01L 2924/19107* (2013.01)

(58) Field of Classification Search
CPC ......... H01L 23/49861; H01L 23/49811; H01L 23/049
See application file for complete search history.

(56) References Cited

U.S. PATENT DOCUMENTS

| | | | | |
|---|---|---|---|---|
| 5,559,374 A | * | 9/1996 | Ohta | ...... H01L 23/13 257/693 |
| 5,767,573 A | * | 6/1998 | Noda | ...... H01L 23/24 257/675 |
| 7,957,158 B2 | * | 6/2011 | Takakusaki | ...... H01L 21/565 174/521 |
| 2005/0116322 A1 | * | 6/2005 | Sando | ...... H01L 23/3135 257/676 |

(Continued)

FOREIGN PATENT DOCUMENTS

| | | |
|---|---|---|
| JP | 2006-066559 A | 3/2006 |
| JP | 2011-091417 A | 5/2011 |

(Continued)

*Primary Examiner* — Michele Fan
(74) *Attorney, Agent, or Firm* — Rabin & Berdo, P.C.

(57) ABSTRACT

In a semiconductor device, first to fourth circuit patterns are formed on an insulating substrate in a case. A first end of a first lead frame is connected via solder to the first circuit pattern and another end of the first lead frame extends outside from the case. In the same way, a first end of a second lead frame is connected via solder to the fourth circuit pattern and another end extends outside from a case. Portions of the second and third circuit patterns are covered by the first lead frame and are respectively buried by insulating layers. In addition, a semiconductor element is provided via solder on a region of the first lead frame above the first circuit pattern. Wires electrically connect the semiconductor element and a region of the second lead frame above the fourth circuit pattern.

23 Claims, 7 Drawing Sheets

(56) References Cited

U.S. PATENT DOCUMENTS

| | | | |
|---|---|---|---|
| 2005/0208789 A1* | 9/2005 | Shirai | G02B 6/4201 439/66 |
| 2008/0067248 A1* | 3/2008 | Hiew | G06K 19/077 235/441 |
| 2008/0224285 A1* | 9/2008 | Lim | H01L 23/4334 257/675 |
| 2009/0103276 A1* | 4/2009 | Sakamoto | H05K 1/144 361/792 |
| 2009/0129038 A1* | 5/2009 | Takakusaki | H01L 23/49861 361/772 |
| 2010/0230473 A1 | 9/2010 | Nagase et al. | |
| 2012/0074552 A1* | 3/2012 | Mashimo | H01L 21/565 257/676 |
| 2014/0374889 A1 | 12/2014 | Denta et al. | |

FOREIGN PATENT DOCUMENTS

| | | |
|---|---|---|
| JP | 2012-209469 A | 10/2012 |
| JP | 2013-138087 A | 7/2013 |
| JP | 2013-258321 A | 12/2013 |

* cited by examiner

SEMICONDUCTOR DEVICE

CROSS-REFERENCE TO RELATED APPLICATION

This application is based upon and claims the benefit of priority of the prior Japanese Patent Application No. 2016-020743, filed on Feb. 5, 2016, the entire contents of which are incorporated herein by reference.

BACKGROUND OF THE INVENTION

1. Field of the Invention

The embodiments discussed herein are related to a semiconductor device.

2. Background of the Related Art

A semiconductor device includes a power semiconductor element and is used as a power converting device or a switching device. As one example, it is possible to configure a semiconductor device that functions as a switching device by connecting semiconductor elements, including IGBT (Insulated Gate Bipolar Transistors), MOSFET (Metal Oxide Semiconductor Field Effect Transistors), and the like.

A semiconductor device includes a main circuit board, which has a main circuit wiring pattern formed on a front surface and a metal plate formed on a rear surface and which is equipped with an insulating layer, and one or more semiconductor elements mounted via solder on the main circuit wiring pattern (see, for example, Japanese Laid-open Patent Publication No. 2013-258321). Heat generated by the semiconductor elements dissipates from the metal plate.

In this semiconductor device, to ensure that the main circuit wiring pattern sufficiently transfers away the heat generated by the semiconductor elements, it is desirable to make pattern thicker so as to increase the capacity, i.e., the amount of heat that can be transferred.

However, when the thickness of the main circuit wiring pattern is increased in this type of semiconductor device, it is necessary, both for the etching process that forms the main circuit wiring pattern and the provision of clearances, to provide a certain width between traces in the main circuit wiring pattern. This leads to an increase in the size of the semiconductor device.

When, as one example, the thickness of the main circuit wiring pattern is limited to avoid an increase in the size of the semiconductor device, as described above the heat capacity, i.e., the amount of heat generated by the semiconductor elements that can be transferred by the main circuit wiring pattern also becomes limited. This means that this semiconductor device has a problem in that when the semiconductor elements are operated, the temperature quickly rises and exceeds the range of operating temperatures, resulting in the risk of breakdown and malfunctioning.

SUMMARY OF THE INVENTION

In one aspect of the embodiments, there is provided a semiconductor device including: a laminated substrate including an insulating substrate and a circuit board, which is provided on a main surface of the insulating substrate and includes a first circuit pattern; a case that is provided on an outer edge of the laminated substrate and surrounds the outer edge; a first lead frame that has a first end connected to the first circuit pattern and another end that is provided outside the case; and a semiconductor element provided on the first lead frame inside the case.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
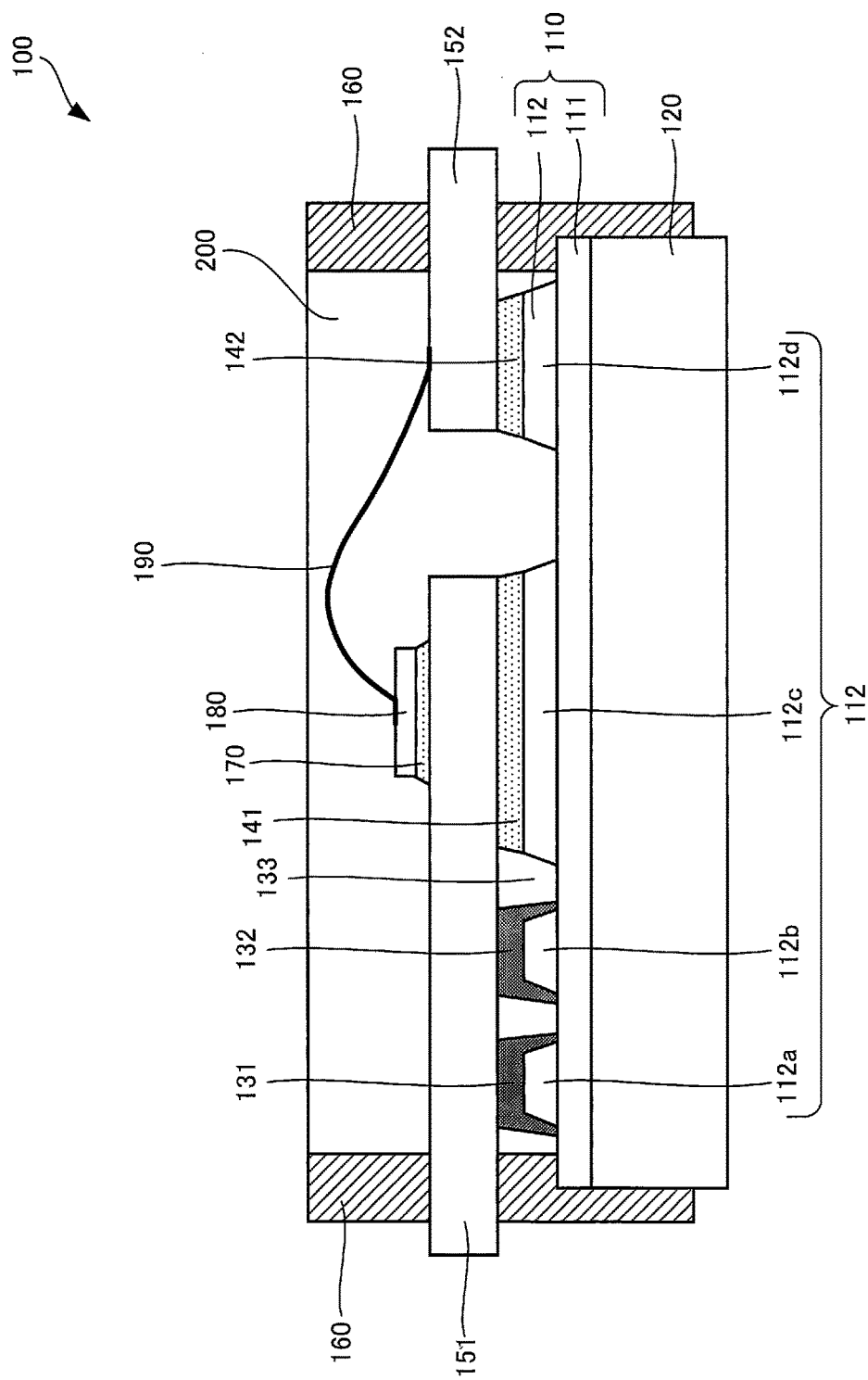
FIG. 1 is a cross-sectional view of a semiconductor device according to an embodiment.

Several embodiments will be described below with reference to accompanying drawings, wherein like reference numerals refer to like elements throughout.

A semiconductor device according to an embodiment will now be described with reference to FIGS. 1 and 2.

Figure 2:
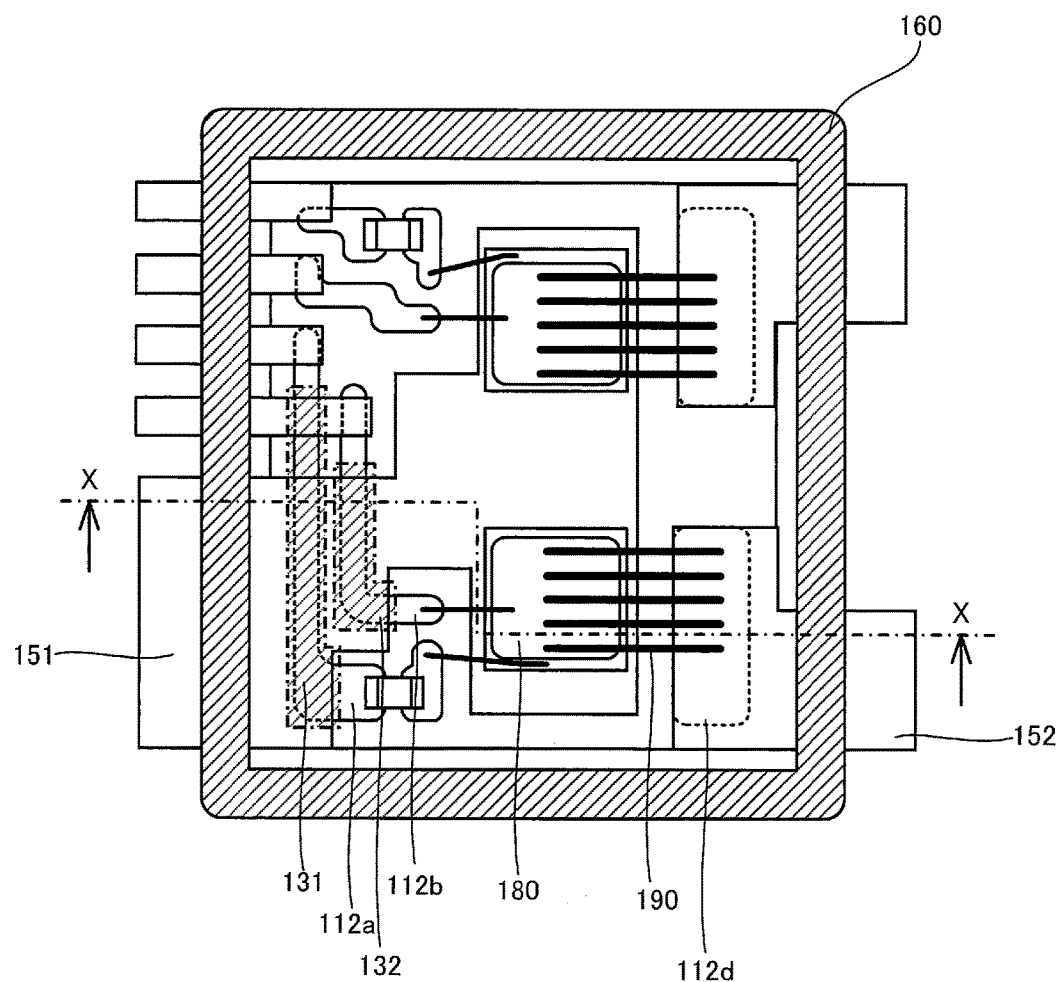
FIG. 2 is a plan view of the semiconductor device according to the embodiment.

FIG. 1 is a cross-sectional view of a semiconductor device according to the one embodiment, and FIG. 2 is a plan view of the semiconductor device of FIG. 1.

Note that FIG. 1 is a cross-sectional view along a dot-dash line X-X in FIG. 2. In FIG. 2, configurations depicted in FIG. 1 have been assigned the same reference numerals.

A semiconductor device 100 includes a laminated substrate 110, which includes an insulating substrate 111 made of ceramic or the like and a circuit board 112 including conductive circuit patterns 112a to 112d formed on a front surface of the insulating substrate 111, and a heatsink 120 that is made of metal, such as aluminum, and formed on a rear surface of the insulating substrate 111.

A first end of a lead frame 151 is connected via solder 141 onto the circuit pattern 112c of the circuit board 112, and another end of the lead frame 151 extends parallel to the front surface of the insulating substrate 111 from a case 160, described later, to the outside. In the same way, a first end of a lead frame 152 is connected via solder 142 onto the circuit pattern 112d of the circuit board 112, and another end of the lead frame 152 extends parallel to the front surface of the insulating substrate 111 from the case 160 to the outside. By connecting the first end of the lead frame 152 via the solder 142 onto the circuit pattern 112d, conduction of heat that has been transferred from a semiconductor element 180 to wires 190 to the rear surface of the circuit board 112 is facilitated.

The circuit patterns 112a and 112b of the circuit board 112 that are positioned on the insulating substrate 111 below the lead frame 151 are buried by insulating layers 131 and 132 made of an insulating resin. As depicted in FIG. 2 (the obliquely shaded parts surrounded by dot-dash lines), the insulating layers 131 and 132 bury only the parts of the circuit patterns 112a and 112b that are covered by the lead frame 151. This ensures that the circuit patterns 112a and 112b and the lead frame 151 are reliably insulated from one another. Note that it is also possible to fill the space between the insulating layers 131 and 132 with resin.

Were the insulating layer 132 to contact one surface out of the circuit pattern 112c and the solder 141, the conducting path for heat from the semiconductor element 180 would be obstructed, resulting in a decrease in the ability to transfer heat. For this reason, it is desirable to provide a gap 133 that prevents the insulating layer 132 from contacting one surface out of the circuit pattern 112c and the solder 141.

The semiconductor element 180 is provided via solder 170 in a region of the lead frame 151 above the circuit pattern 112c. The semiconductor element 180 is also electrically connected to the lead frame 152 by the wires 190.

The case 160 internally houses the laminated substrate 110, the lead frames 151 and 152, the semiconductor element 180, and the wires 190, and is provided at an outer edge of the laminated substrate 110. In addition, the case 160 is filled with sealing resin 200 to seal the laminated substrate 110, the lead frames 151 and 152, the semiconductor element 180, and the wires 190 inside the case 160.

Note that since it is easier for heat to be transferred when the gap 133 is filled with the sealing resin 200 compared to when the gap 133 is hollow, or when no sealing resin or any other solid material fills the gap 133, it is desirable for the gap 133 also to be filled with the sealing resin 200.

This completes the description of the configuration of the semiconductor device 100.

A semiconductor device that is attached to a case and has a semiconductor element provided on a circuit pattern without lead frames being connected to circuit patterns will be described with reference to FIGS. 3 and 4 as a comparative example for the semiconductor device 100 according to the embodiment of FIGS. 1 and 2.

Figure 3:
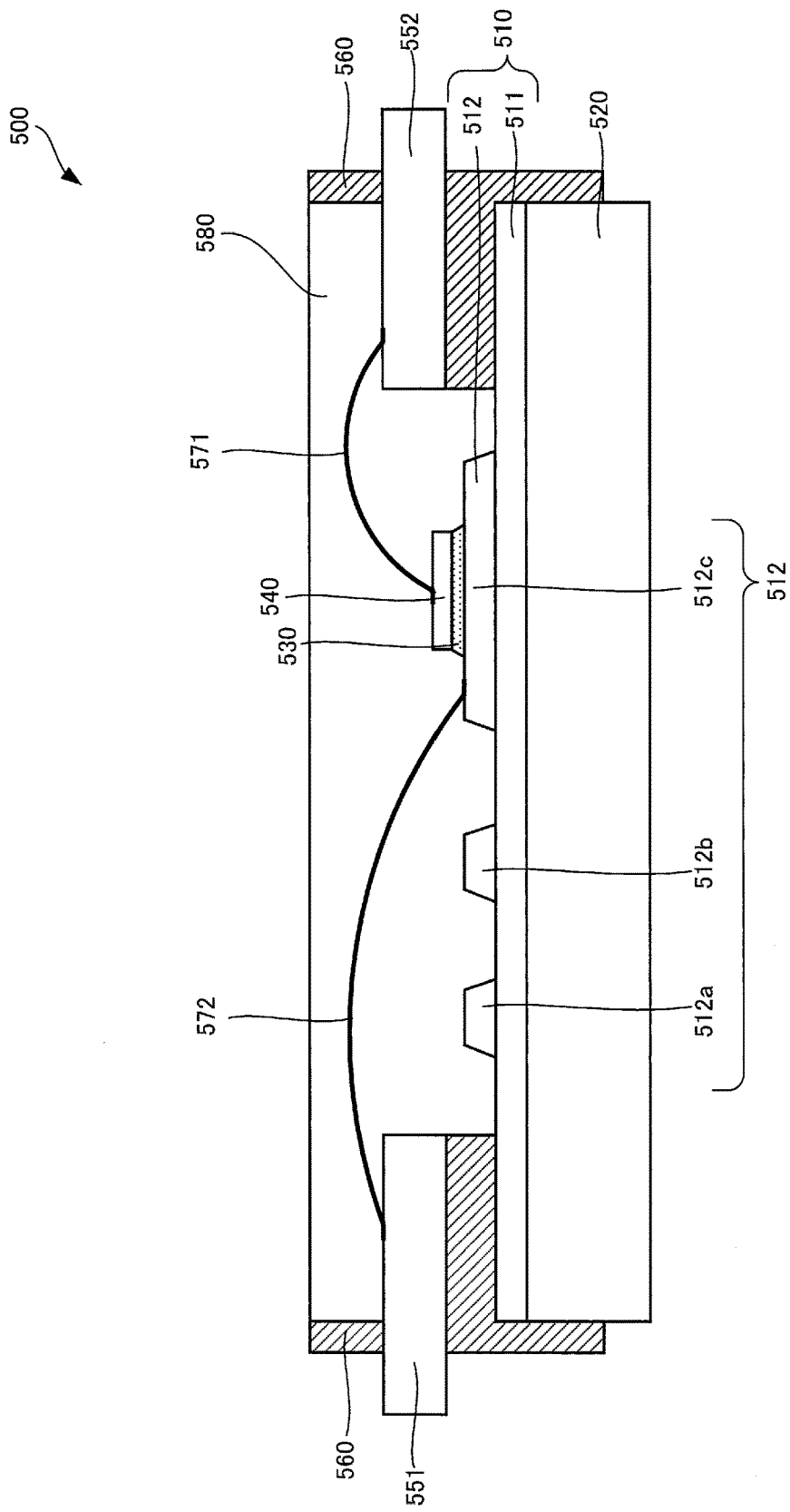
FIG. 3 is a cross-sectional view of a semiconductor device that is a comparative example.
Figure 4:
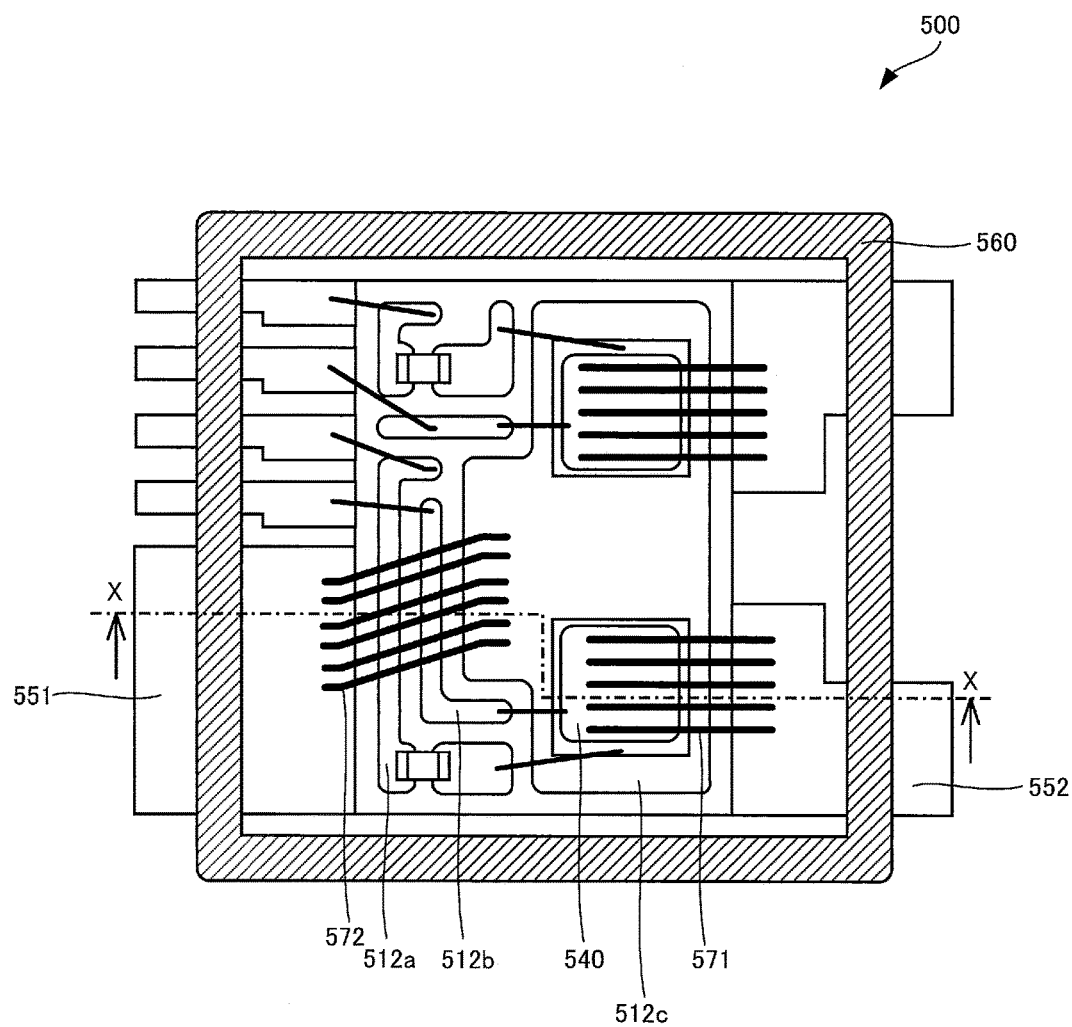
FIG. 4 is a plan view of the semiconductor device that is a comparative example.

FIG. 3 is a cross-sectional view of the semiconductor device that is a comparative example, and FIG. 4 is a plan view of the semiconductor device that is a comparative example.

Note that FIG. 3 is a cross-sectional view along a dot-dash line X-X in FIG. 4. In FIG. 4, configurations depicted in FIG. 3 have been assigned the same reference numerals.

A semiconductor device 500 includes a laminated substrate 510, which includes an insulating substrate 511 made of ceramic or the like and a circuit board 512 including conductive circuit patterns 512a to 512c formed on a front surface of the insulating substrate 511, and a heatsink 520 that is made of metal, such as aluminum, and is formed on a rear surface of the insulating substrate 511.

A semiconductor element 540 is provided via solder 530 on the circuit pattern 512c of the circuit board 512.

A case 560 is attached to an outer edge of the laminated substrate 510 and internally houses the laminated substrate 510, the semiconductor element 540, and wires 571 and 572, described later.

Lead frames 551 and 552 each have a first end that is disposed on the case 560 and another end that extends outside the case 560.

The wires 571 electrically connect the semiconductor element 540 and the lead frame 552, and the wires 572 electrically connect the lead frame 551 and the circuit pattern 512c.

The case 560 is filled with sealing resin 580 to seal the laminated substrate 510, the semiconductor element 540, (the first ends of) the lead frames 551 and 552, and the wires 571 and 572.

With this semiconductor device 500, heat generated when the semiconductor element 540 operates is transferred via the solder 530 to the circuit pattern 512c. The heat is then held in the circuit pattern 512c.

To prevent an increase in the size, it is desirable to reduce the thickness of the semiconductor device 500. As one example, it is desirable to reduce the thickness of the circuit patterns 512a to 512c of the circuit board 512. When the thickness of the circuit patterns 512a to 512c is reduced however, there is a reduction in the heat capacity, i.e., the amount of heat generated by the semiconductor element 540 that can be transferred. This means with the semiconductor device 500, when the semiconductor element 540 is operated, the temperature quickly rises and exceeds the range of operating temperatures, resulting in the risk of breakdown and malfunctioning.

For this reason, the semiconductor device 100 according to the embodiment of FIGS. 1 and 2 includes the laminated substrate 110, which includes the insulating substrate 111 and the circuit board 112 composed of the circuit conductive circuit patterns 112a to 112d formed on the front surface of the insulating substrate 111, and the heatsink 120 formed on the rear surface of the insulating substrate 111, and has the case 160 attached to the outer edge of the laminated substrate 110. In the semiconductor device 100 of FIGS. 1 and 2, the lead frame 151 has the first end that is connected via the solder 141 to the circuit pattern 112c and the other end that extends outside the case 160. In the same way, the lead frame 152 has the first end that is connected via the solder 142 to the circuit pattern 112d and the other end that extends outside the case 160. The circuit patterns 112a and 112b covered by the lead frame 151 are buried by the insulating layers 131 and 132, respectively. In addition, the semiconductor element 180 is provided via the solder 170 on a region of the lead frame 151 above the circuit pattern 112c. The wires 190 electrically connect the semiconductor element 180 and a region of the lead frame 152 above the circuit pattern 112d.

With this semiconductor device 100, heat generated by the semiconductor element 180 is conducted by the solder 170, the lead frame 151, the solder 141, and the circuit pattern 112c. In particular, since the lead frame 151 is thicker than the circuit pattern 112c, compared to the semiconductor device 500 depicted in FIGS. 3 and 4, for example, there is an increase in the heat capacity, i.e., the amount of heat that can be transferred from the semiconductor element 180. This means that the semiconductor device 100 is capable of achieving a sufficient heat capacity to transfer away the heat generated by the semiconductor element 180. Accordingly, with the semiconductor device 100, even when the semiconductor element 180 is operated, there is no sudden rise in temperature and the temperature is kept within the range of operation temperatures, thereby avoiding breakdown and malfunctioning and preventing a fall in the reliability of the semiconductor device 100.

The same can be said for the wires 190 that connect the semiconductor element 180 and the region of the lead frame 152 above the circuit pattern 112d. That is, when heat generated by the semiconductor element 180 is transferred to the wires 190, the heat is conducted by the lead frame 152, the solder 142, and the circuit pattern 112d. This also means that the semiconductor device 100 is capable of achieving a sufficient heat capacity to transfer away the heat generated by the semiconductor element 180.

In the semiconductor device 100, the lead frame 151 has the first end that is connected to the circuit pattern 112*c* of the laminated substrate 110 and the other end that extends out of the case 160, and the lead frame 152 has the first end that is connected to the circuit pattern 112*d* of the laminated substrate 110 and the other end that extends out of the case 160. This means that compared to the semiconductor device 500 depicted in FIGS. 3 and 4, the area of the semiconductor device 100 of FIGS. 1 and 2 in plan view can be reduced. As one example, although the width of the semiconductor device 500 depicted in FIG. 3 is 40 to 50 mm, the width of the semiconductor device 100 depicted in FIG. 1 is around 25 to 35 mm and therefore smaller than the semiconductor device 500.

Next, a method of manufacturing the semiconductor device 100 will be described with reference to FIGS. 5A and 5B and FIGS. 6A and 6B.

FIGS. 5A and 5B and FIGS. 6A and 6B depict the method of manufacturing the semiconductor device according to one embodiment.

First, a metal plate is formed on the insulating substrate 111. The laminated substrate 110 is then constructed by etching this metal plate into desired patterns to form the circuit board 112 composed of the circuit patterns 112*a* to 112*d* on the insulating substrate 111.

Figure 5A:
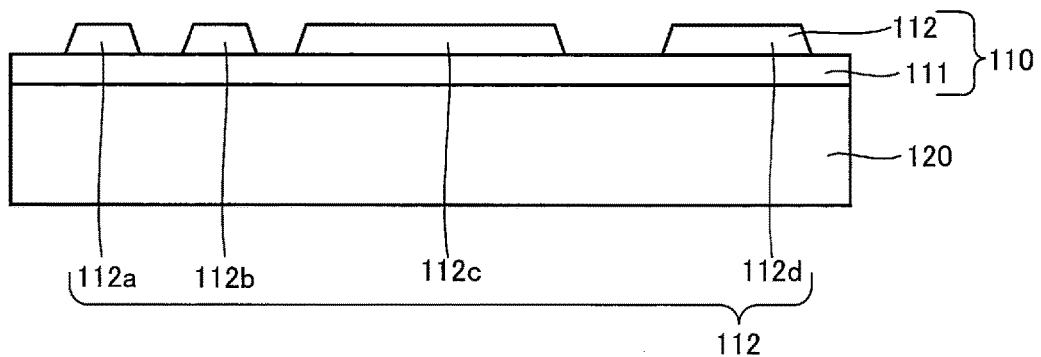
FIGS. 5A and 5B depict a first part of a method of manufacturing the semiconductor device according to an embodiment.

Next, the heatsink 120 made of aluminum or the like is formed on the rear surface of the laminated substrate 110 (the insulating substrate 111) (see FIG. 5A).

After this, the insulating layers 131 and 132 composed of an insulating material, such as epoxy resin, are respectively applied onto predetermined regions of the circuit patterns 112*a* and 112*b* of the circuit board 112 in the laminated substrate 110. The insulating layers 131 and 132 may be applied using a dispenser or the like, or may be applied using screen printing.

Figure 5B:
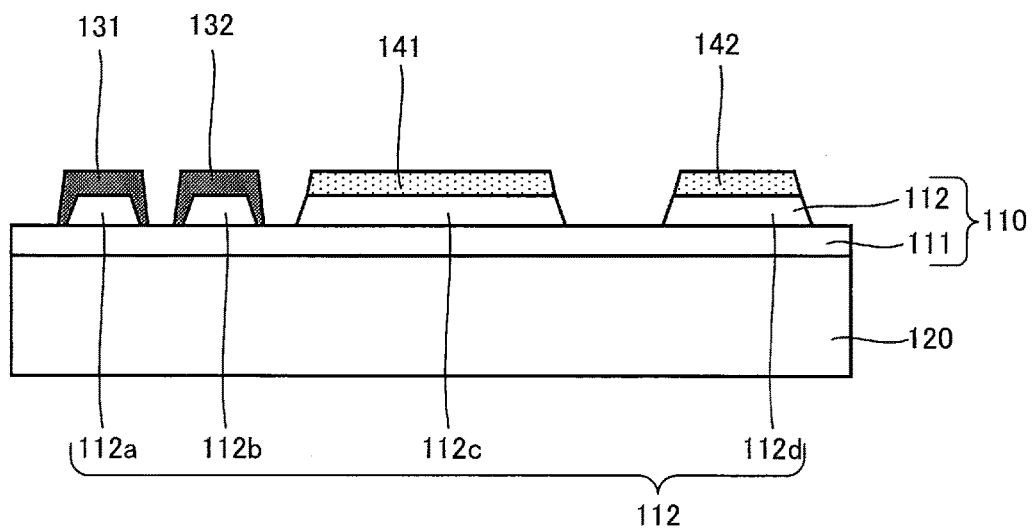

Next, the solder 141 and 142 is applied onto the circuit patterns 112*c* and 112*d* of the circuit board 112 in the laminated substrate 110 (see FIG. 5B).

Note that it is also possible to use a conductive adhesive in place of the solder 141 and 142.

Next, the case 160 to which the lead frames 151 and 152 are attached in advance by insert molding is prepared. The case 160 is attached to the outer edge of the laminated substrate 110, the first end of the lead frame 151 is disposed on the solder 141 and the first end of the lead frame 152 is disposed on the solder 142. Heating is then performed to a predetermined temperature to melt the solder 141 and 142, which is then allowed to solidify. By doing so, the first end of the lead frame 151 and the solder 141 are connected and the first end of the lead frame 152 and the solder 142 are connected (see FIG. 6A).

Note that the case 160 is attached to the laminated substrate 110 using adhesive.

Next, the semiconductor element 180 is disposed via the solder 170 on a region of the lead frame 151 above the circuit pattern 112*c*. Note that solder with a lower melting point than the melting point of the solder 141 and 142 is used as the solder 170. Here, as examples, tin-antimony solder is used as the solder 141 and 142 and tin-silver solder is used as the solder 170. Heating is then performed to a temperature below the melting point of the solder 141 and 142 to melt the solder 170, which is then allowed to solidify. By doing so, the semiconductor element 180 is connected via the solder 170 to a region of the lead frame 151 above the circuit pattern 112*c*.

Figure 6A:
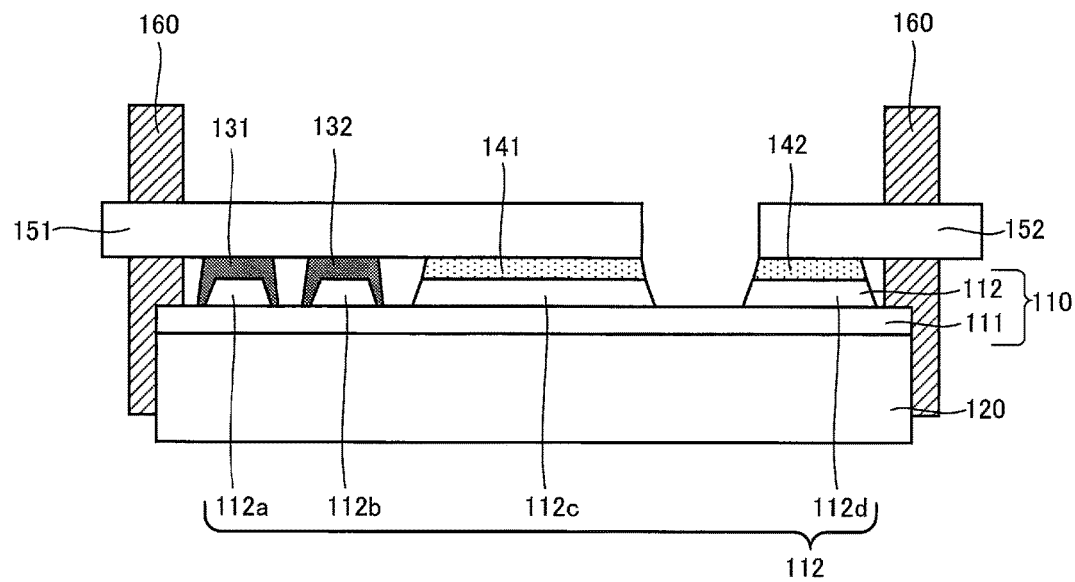
FIGS. 6A and 6B depict a second part of a method of manufacturing the semiconductor device according to the embodiment.
Figure 6B:
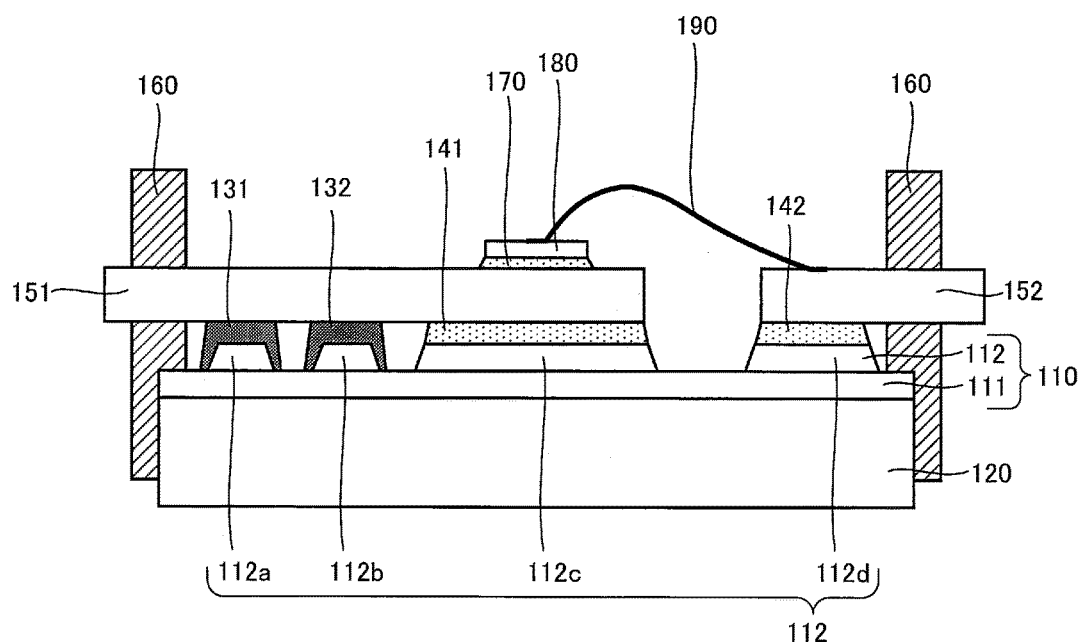

Next, the semiconductor element 180 is electrically connected via the wires 190 to a region of the lead frame 152 above the circuit pattern 112*d* (see FIG. 6B).

After this, the case 160 is filled with the sealing resin 200 to seal the laminated substrate 110, the lead frames 151 and 152, the semiconductor element 180, and the wires 190 inside the case 160.

By doing so, the semiconductor device 100 depicted in FIG. 1 is formed.

Figure 7A:
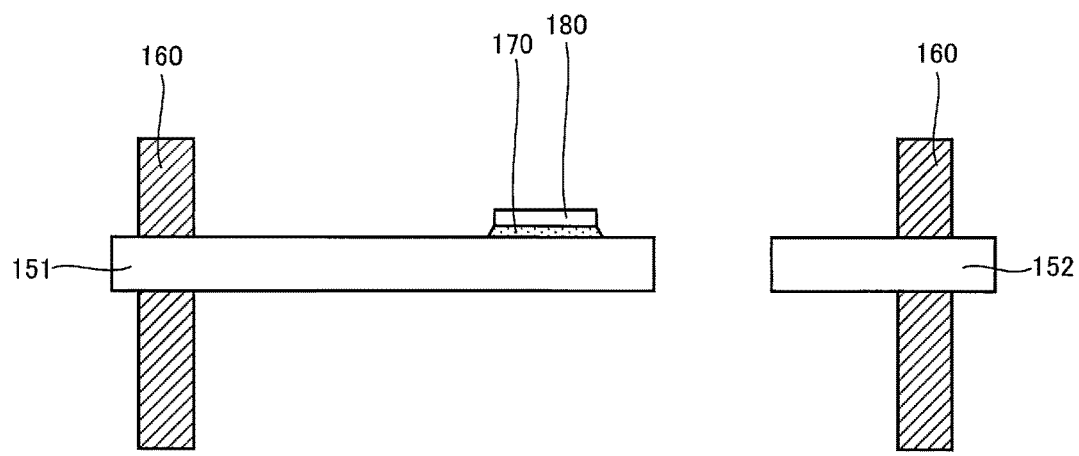
FIGS. 7A and 7B depict another method of manufacturing the semiconductor device according to an embodiment.
Figure 7B:
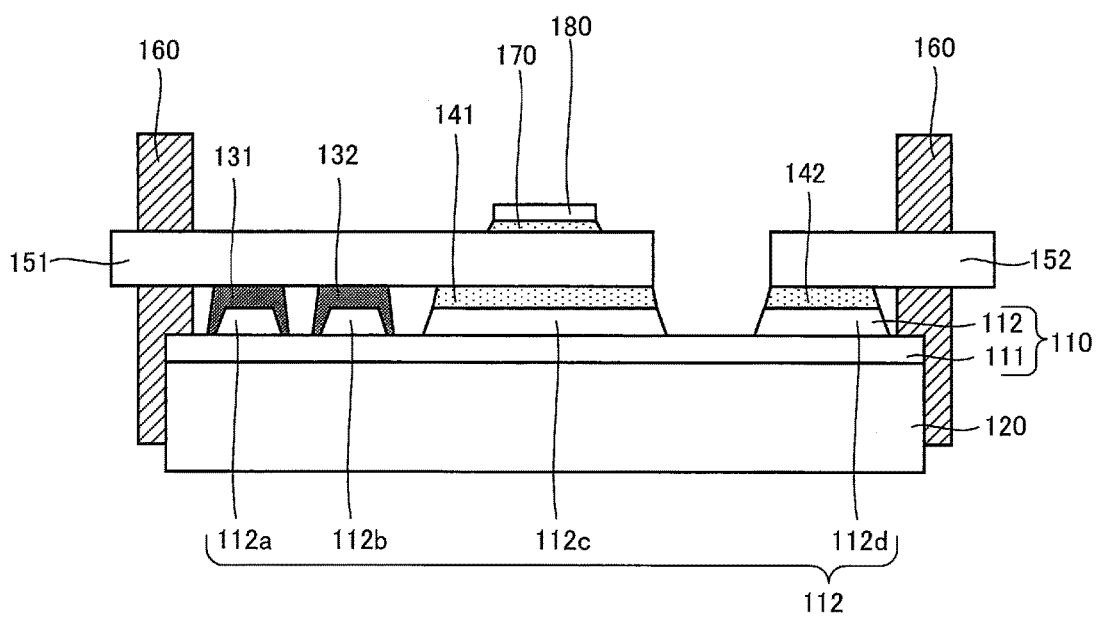

As another method of manufacturing the semiconductor device 100, it is also possible to perform the steps depicted in FIGS. 7A and 7B for example after FIG. 5B.

FIGS. 7A and 7B depict another method of manufacturing a semiconductor device according to the embodiment depicted in FIGS. 1 and 2.

The case 160 to which the lead frames 151 and 152 have been attached in advance is prepared. The semiconductor element 180 is disposed via the solder 170 on a predetermined region of the lead frame 151. Heating is then performed to a predetermined temperature to melt the solder 170 that is then allowed to solidify. By doing so, the first end of the lead frame 151 and the semiconductor element 180 are connected (see FIG. 7A).

Next, the case 160 depicted in FIG. 7A is attached to the laminated substrate 110 depicted in FIG. 5B, one end of the lead frame 151 is set on the solder 141 on the circuit pattern 112*c*, and one end of the lead frame 152 is set on the solder 142 on the circuit pattern 112*d*. Note that the case 160 is attached to the laminated substrate 110 via adhesive. In this method, solder with a lower melting point than the melting point of the solder 170 is used as the solder 141 and 142. Here, as examples, tin-silver solder is used as the solder 141 and 142 and tin-antimony solder is used as the solder 170. Heating is performed to a temperature below the melting point of the solder 170 to melt the solder 141 and 142, which is then allowed to solidify. By doing so, the first ends of the lead frames 151 and 152 are respectively connected to the circuit patterns 112*c* and 112*d* via the solder 141 and 142 (see FIG. 7B).

Next, the semiconductor element 180 is electrically connected to the region of the lead frame 152 above the circuit pattern 112*d* by the wires 190.

After this, the case 160 is filled with the sealing resin 200 to seal the laminated substrate 110, the lead frames 151 and 152, the semiconductor element 180 and the wires 190 inside the case 160.

By doing so, the semiconductor device 100 depicted in FIG. 1 is formed.

With the semiconductor device 500 depicted in FIGS. 3 and 4, rear-surface electrodes of the semiconductor element 540 and the lead frame 551 are electrically connected by the wires 572. On the other hand, with the semiconductor device 100, rear-surface electrodes of the semiconductor element 180 are electrically connected directly to the lead frame 151. This means that with the semiconductor device 100, it is possible to reduce the number of wire bonding steps compared to the semiconductor device 500, which reduces the manufacturing cost.

According to the present embodiments, it is possible to avoid a drop in the reliability of a semiconductor device while avoiding an increase in size.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a laminated substrate including an insulating substrate and a circuit board provided on a main surface of the insulating substrate, the circuit board including a first circuit pattern;
a hollow case provided on an outer edge of the laminated substrate, the laminated substrate being surrounded by the hollow case in a plan view of the semiconductor device;
a first lead frame having a first end soldered directly to the first circuit pattern, and another end provided outside the case, the first lead frame extending through the case such that the first end is located inward of an inside surface of the case and the second end is located outward of an outside surface of the case; and
a semiconductor element soldered directly to the first lead frame inside the case.

2. The semiconductor device according to claim 1, wherein the semiconductor element is provided on a region of the first lead frame, the region being above the first circuit pattern.

3. The semiconductor device according to claim 2, wherein the circuit board includes a second circuit pattern that is provided on the main surface of the insulating substrate and is disposed between the main surface of the insulating substrate and the first lead frame; and
the semiconductor device further includes an insulating layer covering the second circuit pattern and provided in a gap between the second circuit pattern and the first lead frame.

4. The semiconductor device according to claim 3, wherein a gap is provided between the insulating layer and a side portion of the first circuit pattern.

5. The semiconductor device according to claim 3, wherein the insulating layer covers an entire main surface of the second circuit pattern such that the second circuit pattern is buried by the insulating layer.

6. The semiconductor device according to claim 1, wherein the first lead frame is thicker than the first circuit pattern.

7. The semiconductor device according to claim 1, wherein the semiconductor element and the laminated substrate are formed on opposite sides of the first lead frame.

8. The semiconductor device according to claim 1, wherein
the hollow case is attached to the laminated substrate on the outer edge of the laminated substrate using adhesive, and
the first lead frame is attached to the case by insert molding.

9. A semiconductor device, comprising:
a laminated substrate including an insulating substrate and a circuit board provided on a main surface of the insulating substrate, the circuit board including a first circuit pattern;
a case provided on an outer edge of the laminated substrate and surrounding the outer edge;
a first lead frame having a first end connected to the first circuit pattern and another end provided outside the case; and
a semiconductor element provided on the first lead frame inside the case,
wherein the circuit board includes a second circuit pattern that is provided on the main surface of the insulating substrate and is disposed between the main surface of the insulating substrate and the first lead frame, and a third circuit pattern that is provided on the main surface of the insulating substrate and is disposed on an opposite side of the first circuit pattern to the second circuit pattern, and
the semiconductor device further includes:
a second lead frame that has a first end connected to the third circuit pattern and another end provided outside the case; and
a wire connected to the semiconductor element and a region of the second lead frame above the third circuit pattern.

10. The semiconductor device according to claim 9, wherein the second lead frame is thicker than the third circuit pattern.

11. The semiconductor device according to claim 9, wherein the second lead frame and the third circuit pattern are connected by solder or conductive adhesive.

12. The semiconductor device according to claim 9, wherein
the case is attached to the laminated substrate on the outer edge of the laminated substrate using adhesive;
the first and second lead frames are attached to the case by insert molding; and
the semiconductor device further includes an insulating layer covering an entire main surface of the second circuit pattern such that the second circuit pattern is buried by the insulating layer, the insulating layer being provided in a gap between the second circuit pattern and the first lead frame.

13. A semiconductor device comprising:
a laminated substrate including an insulating substrate and a circuit board provided on a main surface of the insulating substrate, the circuit board including a first circuit pattern;
a case provided on an outer edge of the laminated substrate and surrounding the outer edge;
a first lead frame having a first end connected to the first circuit pattern and another end provided outside the case; and
a semiconductor element provided on the first lead frame inside the case on a region of the lead frame above the first circuit pattern, wherein
the circuit board includes a second circuit pattern that is provided on the main surface of the insulating substrate and is disposed between the main surface of the insulating substrate and the first lead frame,
the semiconductor device further includes an insulating layer covering the second circuit pattern and provided in a gap between the second circuit pattern and the first lead frame, and
a gap is provided between the insulating layer and a side portion of the first circuit pattern.

14. The semiconductor device according to claim 13, wherein
the case is attached to the laminated substrate on the outer edge of the laminated substrate using adhesive; and
the first lead frame is attached to the case by insert molding.

15. A semiconductor device comprising:
a laminated substrate including an insulating substrate and a circuit board provided on a main surface of the insulating substrate, the circuit board including a first circuit pattern;
a case provided on an outer edge of the laminated substrate and surrounding the outer edge;
a first lead frame having a first end soldered directly to the first circuit pattern by a first solder and another end provided outside the case; and
a semiconductor element soldered directly to the first lead frame inside the case via a second solder,
wherein the first circuit pattern, the first solder, the first lead frame, the second solder, and the semiconductor element are stacked in this order, and
wherein the circuit board includes a second circuit pattern that is provided on the main surface of the insulating substrate and is disposed between the main surface of the insulating substrate and the first lead frame.

16. The semiconductor device according to claim 15, wherein the semiconductor element is provided on a region of the first lead frame, the region being above the first circuit pattern.

17. The semiconductor device according to claim 16, wherein
the semiconductor device further includes an insulating layer covering the second circuit pattern and provided in a gap between the second circuit pattern and the first lead frame.

18. The semiconductor device according to claim 17, wherein a gap is provided between the insulating layer and a side portion of the first circuit pattern.

19. The semiconductor device according to claim 17, wherein the circuit board includes a third circuit pattern that is provided on the main surface of the insulating substrate and is disposed on an opposite side of the first circuit pattern to the second circuit pattern, and
the semiconductor device further includes:
a second lead frame that has a first end connected to the third circuit pattern and another end provided outside the case; and
a wire connected to the semiconductor element and a region of the second lead frame above the third circuit pattern.

20. The semiconductor device according to claim 19, wherein the second lead frame is thicker than the third circuit pattern.

21. The semiconductor device according to claim 19, wherein the second lead frame and the third circuit pattern are connected by a third solder or conductive adhesive.

22. The semiconductor device according to claim 15, wherein the first lead frame is thicker than the first circuit pattern.

23. The semiconductor device according to claim 15, wherein
the case is attached to the laminated substrate on the outer edge of the laminated substrate using adhesive; and
the first lead frame is attached to the case by insert molding.

* * * * *